United States Patent [19]

Laskaris et al.

[11] Patent Number: 5,278,502
[45] Date of Patent: Jan. 11, 1994

[54] REFRIGERATED SUPERCONDUCTING MR MAGNET WITH INTEGRATED CRYOGENIC GRADIENT COILS

[75] Inventors: Evangelos T. Laskaris, Schenectady; Bizhan Dorri, Clifton Park; Mark E. Vermilyea, Schenectady; Otward M. Mueller, Ballston Lake, all of N.Y.

[73] Assignee: General Electric Company, Schenectady, N.Y.

[21] Appl. No.: 759,387

[22] Filed: Sep. 13, 1991

[51] Int. Cl.⁵ ............................................. G01V 3/00
[52] U.S. Cl. ..................................... 324/318; 324/319
[58] Field of Search .................. 324/318, 319, 320; 335/216, 296, 297, 300

[56] References Cited

U.S. PATENT DOCUMENTS

| | | | |
|---|---|---|---|
| 4,646,024 | 2/1987 | Schenck et al. | 324/318 |
| 4,652,824 | 3/1987 | Oppelt | 324/319 |
| 4,737,716 | 4/1988 | Roemer et al. | 324/319 |
| 4,876,510 | 10/1989 | Siebold et al. | 324/318 |
| 4,924,184 | 5/1990 | Yoda | 324/318 |
| 4,924,185 | 5/1990 | Matsutani | 324/319 |
| 4,924,198 | 5/1990 | Laskaris | 335/216 |

FOREIGN PATENT DOCUMENTS 0433002 6/1991 European Pat. Off. .

Primary Examiner—Louis Arana
Attorney, Agent, or Firm—James R. McDaniel; Paul R. Webb, II

[57] ABSTRACT

This invention relates to refrigerated superconducting MR magnets having integrated cryogenic gradient coils. In particular, the amount of eddy currents produced by the magnet are substantially reduced while reducing the size and weight, and, therefore, the cost of the superconducting magnet required to produce an acceptable MR image.

15 Claims, 4 Drawing Sheets

REFRIGERATED SUPERCONDUCTING MR MAGNET WITH INTEGRATED CRYOGENIC GRADIENT COILS

CROSS REFERENCE TO RELATED APPLICATIONS

This application is related to commonly assigned U.S. patent applications Ser. Nos. 759,337, 759,389 and 759,336, entitled "Refrigerated Superconducting MR Magnet with Integrated Gradient Coils"; "Eddy Current Free MRI Magnet With Integrated Gradient Coils"; and "Demountable Conduction Cooled Current Leads For Refrigerated Superconducting Magnets", respectively.

BACKGROUND OF THE INVENTION

1. Field of the Invention

This invention relates to refrigerated superconducting MR magnets having integrated cryogenic gradient coils. Such structures of this type generally reduce the size and weight and therefore, the cost of the superconducting magnet required for an MR imaging system while substantially eliminating the resultant eddy currents produced in the magnet.

2. Description of the Related Art

Present superconducting MR magnets employ windings which operate in liquid helium to maintain the temperature at approximately 4 K. The liquid helium pool requires a vessel which is vacuum tight and which meets ASME pressure vessel requirements; such a vessel is typically made of welded aluminum alloy cylinders and flanges. Thermal radiation shields, of which two are typically used, are also made of welded aluminum pieces and contain the helium vessel. When the gradient coils are pulsed in the bore of the magnet, the resulting time changing magnetic flux in any of the electrically conducting cylinders sets up eddy currents which, in turn, produce other magnetic fields which degrade the quality of the desired gradient field in space and time. This behavior makes it attractive for the aggressive pulse sequences which are routinely used in MR imaging today to use a second set of gradient coils in the magnet bore. This shield gradient coil sets up fields which counteract those of the main gradient coil radially outside of the shield coil, thus greatly reducing any mutual inductance with conducting members such as the thermal shields and minimizing the resultant eddy currents.

The use of such shield gradient coils increases the radial thickness of the gradient coil set relative to a simple single coil set because of the required gap between them and dictates the size, and thus weight and cost, of a conventional magnet, which normally lies radially outside of the shield gradient. Therefore, a more advantageous system, then, would be realized if the magnet could be made to have no mutual coupling to the gradient coil set and if it could be placed in much closer proximity to the gradients without having any deleterious eddy currents induced in it. The resulting system could be dramatically smaller and less expensive than existing ones.

It is apparent from the above that there exists a need in the art for a refrigerated superconducting MR magnet which is reduced in size, weight and cost through simplicity of parts and uniqueness of structure, and which at least equals the imaging characteristics of known superconducting magnets, but which at the same time substantially reduces the amounts of resultant eddy currents produced in the magnet by the gradient coils. It is a purpose of this invention to fulfill this and other needs in the art in a manner more apparent to the skilled artisan once given the following disclosure.

SUMMARY OF THE INVENTION

Generally speaking, this invention fulfills these needs by providing a refrigerated MR imaging magnet for reducing eddy currents, comprising at least two gradient coil/thermal shield means located at a predetermined distance away from each other, a magnet cartridge means having a coil form means and a main coil means wound on said coil form means and substantially located radially between said gradient coil/thermal shield means, a support means for said gradient coil/thermal shield means and said magnet cartridge means, a vacuum bore tube means, a RF shield means rigidly attached to said bore tube means, a passive shim means substantially located adjacent to said bore means, a RF coil means located at a predetermined distance away from said bore tube means, and a vacuum enclosure means which includes said vacuum bore tube means and which substantially encloses said gradient coil/thermal shield means and said magnet cartridge means.

In certain preferred embodiments, the gradient coil/thermal shield means acts as a thermal radiation shield and as a gradient coil for the system. Also, the gradient coil/thermal shields and magnet cartridge are supported within the enclosure by independent sets of mechanical supports to reduce vibration of the magnet cartridge when the gradient coils are electrically pulsed. In addition, the magnet cartridge must be mechanically decoupled from the refrigerator cold head. Finally, both the main and shield gradient coils are layered with electrically decoupled strips of any high thermal conductivity material such as copper or aluminum in order to provide the required axial heat conduction to the refrigerator while reducing to a tolerable level the resultant eddy currents resulting from the electrical pulsation of the gradient coils.

In another further preferred embodiment, the size and weight and, ultimately, the cost of the MR imaging system is reduced when the superconducting magnet of the present invention is employed while substantially eliminating the eddy currents produced in the magnet by the electrical pulsation of the gradient coils.

The preferred superconducting MR magnet, according to this invention, offers the following features: lightness in weight; good superconducting characteristics; good MR imaging characteristics; good stability; substantially reduced resultant eddy currents; good durability; improved economy; and high strength for safety. In fact, in many of the preferred embodiments, these factors of weight, eddy currents and economy are optimized to an extent considerably higher than heretofore achieved in prior, known superconducting MR magnets.

BRIEF DESCRIPTION OF THE DRAWINGS

The above and other features of the present invention which will become more apparent as the description proceeds are best understood by considering the following detailed description in conjunction with the accompanying drawings wherein like characters represent like parts throughout the several views and in which.

DETAILED DESCRIPTION OF THE INVENTION

Figure 1:
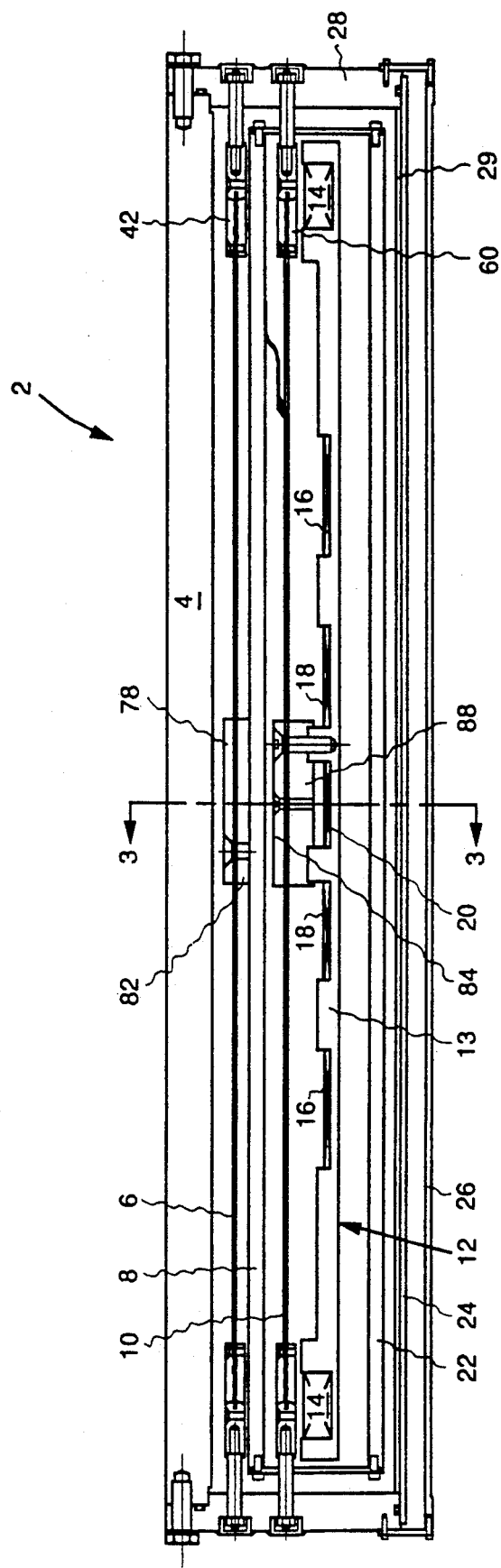
FIG. 1 is a side plan view of a refrigerated superconducting MR magnet with integrated cryogenic gradient coils, according to the present invention.

With reference first to FIG. 1, there is illustrated a refrigerated superconducting, integrated cryogenic gradient coil MR magnet 2. Basically, magnet 2 includes vacuum vessel cylinder 4, supports 6, 10, vacuum enclosure bore tube 24, shield gradient coil/outer thermal shield assembly 8, magnet cartridge 12, coil form 13, coils 14, 16, 18, 20, main gradient coil/inner thermal shield assembly 22, RF coil 26, magnetic shield end plate 28, RF shield 29 and mechanical supports 78, 82, 84, 88.

Figure 2:
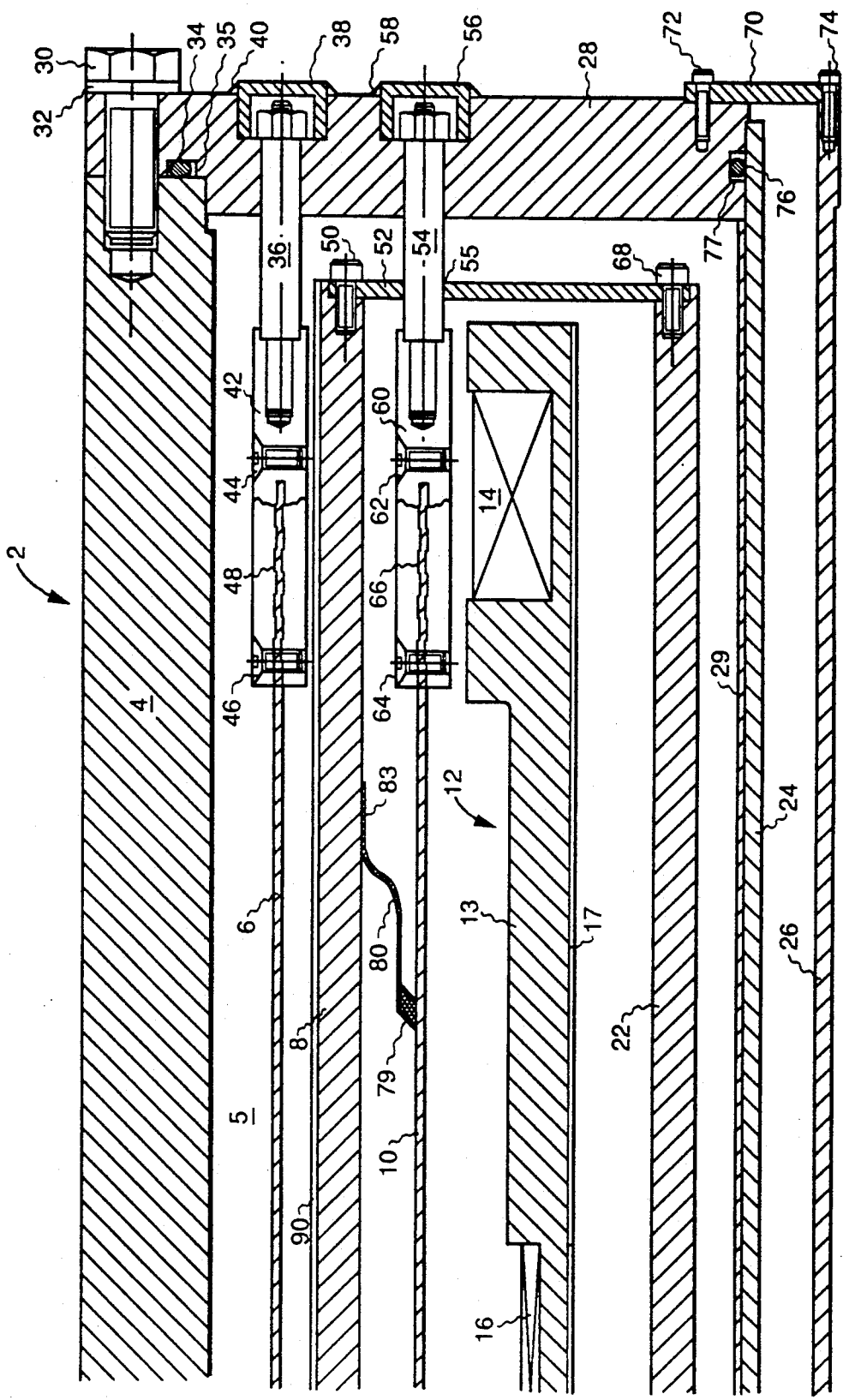
FIG. 2 is a detailed, side plan view drawing showing how the gradient coils, the RF coil, the main coil form and the mechanical supports are attached to the enclosure, according to the present invention.

With respect to FIG. 2, the elements found in FIG. 1, except mechanical supports 78,82,84 and 88, will be more specifically set forth. In particular, vacuum vessel 4 which, preferably, is constructed of any suitable ferromagnetic and impermeable material such as iron or carbon steel is rigidly attached to end plate 28 by a conventional fastener 30 and a conventional washer 32. End plate 28, preferably, is constructed of any suitable ferromagnetic and impermeable material such as iron or carbon steel. A conventional elastomeric o-ring 34 is placed in groove 35 in end plate 28. O-ring 34 prevents any leakage from the atmosphere into cavity 5 along the interface between vessel 4 and end plate 28.

Support 6, which preferably, is constructed of any suitable fiberglass material is rigidly held within clamp 42 which, in turn, is held together with conventional fasteners 44 and 46. Supports are located approximately 90° from each other around the circumference of shield gradient coil outer thermal shield assembly 8. Clamp 42, preferably, is constructed of stainless steel and contains grooves 48 which mate with matching grooves in support 6 so that support 6 remains stationary within clamp 42. Clamp 42 is rigidly attached to end plate 28 by a conventional close tolerance fastener 36. The grooves in support 6 are constructed by conventional machining techniques. A cap 38 is placed over end plate 28 at the place where fastener 36 connects with end plate 28 and a vacuum tight weldment 40 is placed around cap 38 to provide a vacuum seal between cap 38 and end plate 28. Cap 38 and weldment 40 are used to substantially eliminate any leakage from the atmosphere to cavity 5 along fastener 36.

Figure 3:
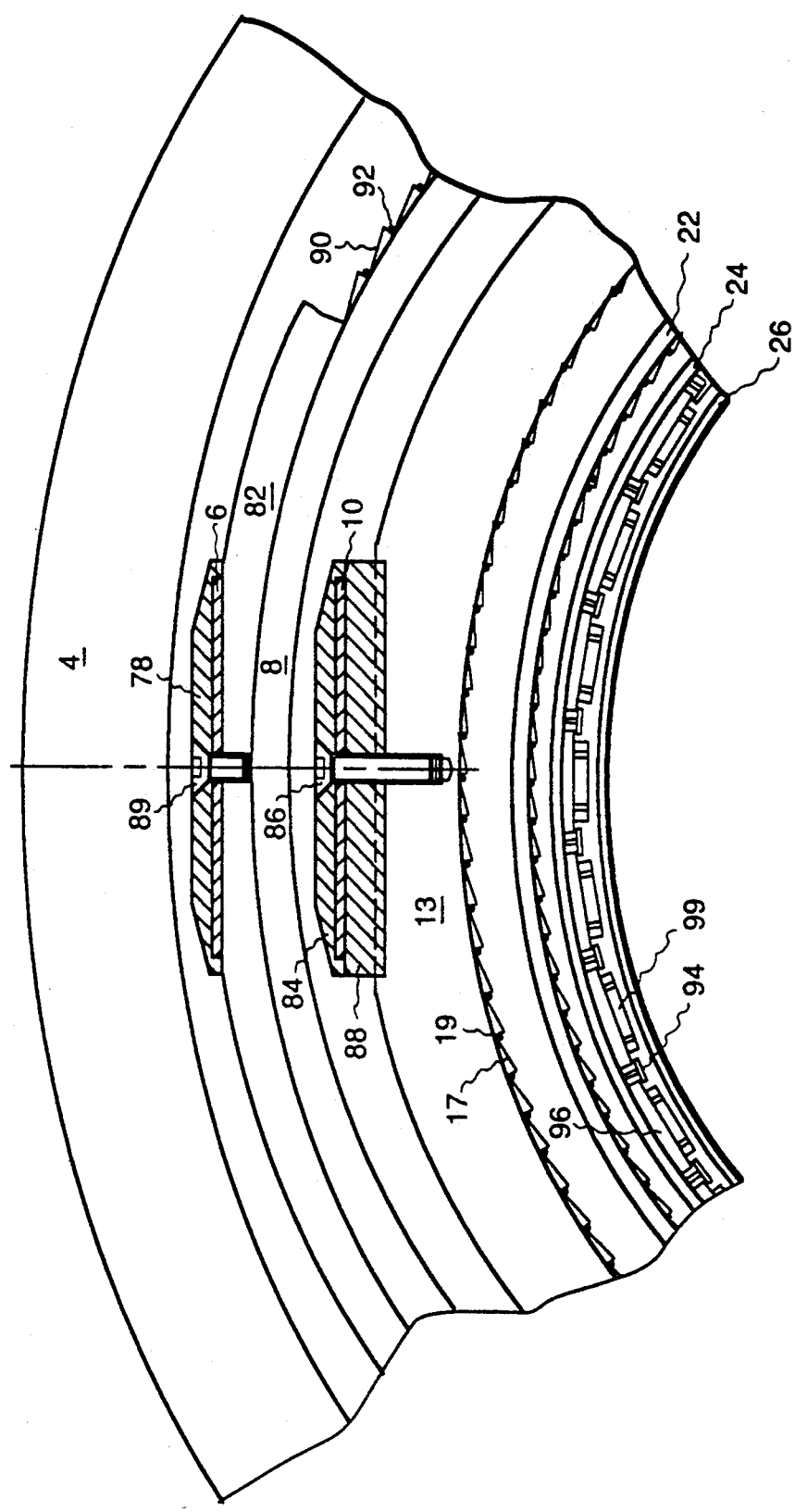
FIG. 3 is a detailed, end plan view drawing illustrating the connection between the shield gradient coil, the main coil form, and the mechanical supports taken along line 3—3 in FIG. 1, according to the present invention.

Located below support 6 is shield gradient coil/outer thermal shield assembly 8, hereinafter referred to as assembly 8. Assembly 8, preferably, is constructed substantially the same as the gradient coil set forth in U.S. Pat. No. 4,737,716 to Roemer et al., entitled "Self-Shielded Gradient Coils for Nuclear Magnetic Resonance Imaging" and assigned to the same assignee as the present invention. In order to assume the proper thermal shielding and to substantially eliminate eddy currents induced from the pulsation of the gradient coil, the conductive part of assembly 8 is electrically segmented in the circumferential direction. In particular, overlapping axial straps 90 (FIG. 3) of any material with high thermal conductivity such as copper or aluminum are bonded by conventional bonding techniques to the inner or outer surface of assembly 8 and are electrically insulated from one another by insulators 92, preferably, a film insulation such as Mylar polyethylene terephthalate film. Straps 90 provide good axial thermal conduction. Insulators 92 are either applied directly to each strap 90 or are inserted at the overlapping interface between each strap 90 during assembly. Coil/shield assembly 8 is rigidly attached to end flange 52 by fastener 50 with an indium interface material to form a high thermal conductivity joint. End flange 52, preferably, is constructed of copper. Coil/shield 8 is also rigidly attached to support 6 by mechanical supports 78,82 (FIGS. 1 and 3). The suspension system for coil/shield assembly consisting of coil/shields 8 and 22 and end flanges 52 is designed to transmit vibration from the coil/shield assembly to the vacuum vessel 4 to minimize vibration of magnet cartridge 12.

Thermal strap 80 which, preferably, is constructed of copper, thermally connects support 10 to coil/shield 8. Strap 80 is rigidly connected to coil/shield 8 by a high thermal conductivity joint 83. Strap 80 is rigidly connected to support 10 by a high thermal conductivity joint 79. Strap 80 provides a conduction path between coil/shield 8 and support 10 away from end plates 28 so that heat can be shunted to coil/shield 8 along strap 80 instead of being conducted along support 10 to magnet cartridge 12.

Magnet cartridge 12 consists of coil form 13, which, preferably, is constructed of any suitable fiberglass reinforced epoxy material, and coils 14, 16, 18, 20. The entire structure is epoxy impregnated for good thermal conductivity and high strength. Cartridge 12 is substantially constructed the same as winding 13 as set forth in U.S. Pat. No. 4,924,198 to E. T. Laskaris, entitled "Superconductive Magnet Resonance Magnet Without Cryogenes" and assigned to the same assignee as the present invention. Coils 14,16,18,20, preferably, are constructed of $Nb_3Sn$ which are wound by conventional techniques on form 13. Cartridge 12 is rigidly secured to support 10 by mechanical supports 84,88 (FIG. 1). In this manner, the connections between cartridge 12, support 10 and mechanical supports 84,88 substantially reduce any vibrations created in cartridge 12 which, in turn, reduces the likelihood of image artifacts being created. Support 10 which, preferably, is constructed of any suitable fiberglass material is rigidly held within clamp 60 which, in turn is held together with conventional fasteners 62 and 64. Clamp 60, preferably, is constructed of stainless steel and contains grooves 66 which mate with the matching grooves in support 10 so that support 10 remains stationary within clamp 60. The grooves in clamp 60 and support 10 are constructed by conventional machining techniques. Clamp 60 is rigidly attached to end plate 28 by a conventional close tolerance fastener 54. Fastener 54 also passes through an opening 55 in end flange 52. A cap 56 is placed over end plate 28 at the place where fastener 54 connects with end plate 28 and a vacuum tight weldment 58 is placed around cap 56 provide a vacuum seal between cap 56 and end plate 28. Cap 56 and weldment 58 are used to substantially eliminate any leakage from the atmosphere to cavity 5 along fastener 54.

Located along the inner diameter of form 13 are strips 17 (FIG. 3). Strips 17, preferably, are constructed of copper or aluminum or any other high thermal conductivity material. Strips 17 are placed on form 13 in an overlapping fashion such that at the areas where the edges of strips 17 overlap, an insulation 19, such as Mylar polyethylene terephthalate film is placed between the overlapping areas so that strips 17 do not electrically contact each other. Insulation 19 can either be applied directly to strips 17 or placed between the areas where strips 17 overlap during assembly. Strips 17 provide axial heat conduction for cartridge 12 while minimizing eddy currents created in cartridge 12 which, in turn, reduces the likelihood of image artifacts being created.

Located radially inside of cartridge 12 is main gradient coil/thermal shield assembly 22, hereinafter referred to as coil/shield assembly 22. Assembly 22, is constructed in the same manner and with the same materials as coil/shield assembly 8 with the exception that the gradient windings are configured differently according to conventional techniques as set forth in U.S. Pat. No. 4,737,716. Coil/shield assembly 22 is rigidly attached to end flange 52 by fastener 68 with an indium interface material to form a high thermal conductivity joint. A conventional RF shield 29 is rigidly attached to bore tube 24 by a conventional adhesive such that shield 29 is positioned axially within end plate 28. Bore tube 24 which, preferably, is constructed of a vacuum tight fiber-reinforced epoxy material is contained within end plates 28. A conventional, elastomeric o-ring 76 is located in a groove 77 in each end plate 28 so that there is substantially no leakage from the atmosphere along the interface between bore tube 24 and end plate 28 into cavity 5.

A conventional RF coil 26 is rigidly attached to extension 70 by a conventional fastener 74. Coil 26, preferably, is constructed of fiberglass reinforced epoxy and copper while extension 70 is constructed of stainless steel. Extension 70 is rigidly attached to end plate 28 by a conventional fastener 72.

It is to be understood that while less than one half of magnet 2 is depicted in FIG. 2, the magnet is symmetric about its axial midplane as evidenced by FIG. 1.

FIG. 3 more clearly illustrates the connections between coil/shield assembly 8 and support 6, and between coil form 13 and support 10, respectively. In particular, coil/shield assembly 8 is rigidly attached to support 6 by mechanical supports 78,82 and a conventional fastener 89. Mechanical supports 78,82, preferably, are constructed of a stainless steel which is nonmagnetic in the temperature range of 10-40 K. Coil form 13 is rigidly attached to support 10 by mechanical supports 84,88 and conventional fasteners 86. Mechanical supports 84,88, preferably, are constructed of the same material as supports 78,82. As mentioned earlier, coil/shield assembly 8 and coil form 13 are attached to their respective mechanical supports in order to reduce vibrations of cartridge 12 induced by vibrations of gradient coils 8 and 22 which, in turn, improves the quality of the images produced by magnet 2.

Figure 4:
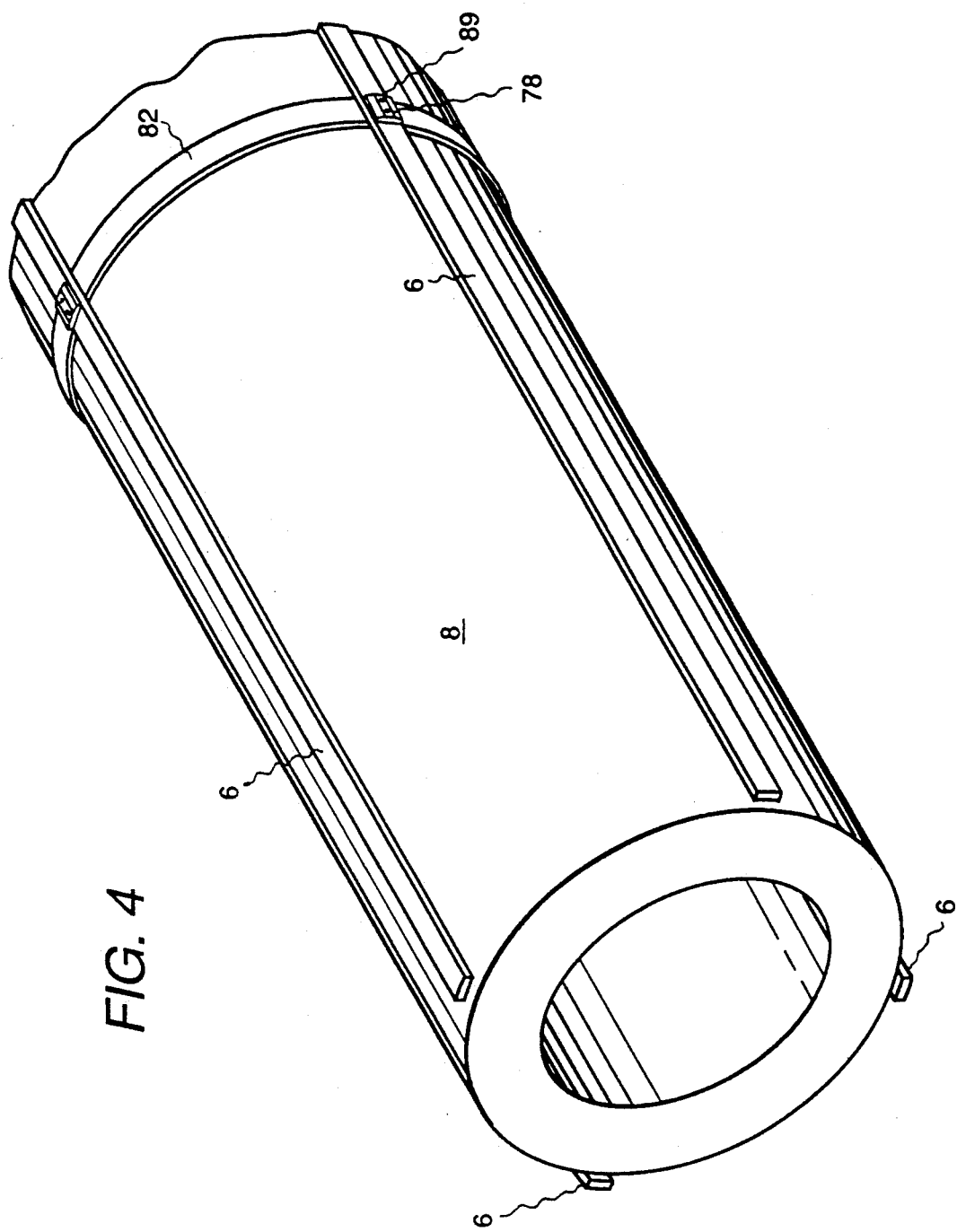
FIG. 4 is a schematic drawing depicting the locations of the mechanical supports with respect to the shield gradient coil and the main coil form, according to the present invention.

FIG. 4 is a schematic representation of the orientation of supports 6 around coil/shield 8. In particular, supports 6, preferably, are located at approximately 90° from each other around the circumference of coil/shield 8. Also depicted are mechanical supports 78 and fasteners 89. Supports 6 are positioned around coil/shield 8 in this manner in order to rigidly support the gradient coil assembly within the vessel 4.

Radially inward of bore 24 is a space for a passive shim set which includes axial rails 94, drawers 96 and conventional passive shims 98 (FIG. 3). In particular, rails 94 are bonded by conventional bonding techniques to the inner radial surface of bore 24 to provide support for drawers 96. Drawers 96, preferably, are constructed of fiberglass and are used to carry passive shims 98.

In order to properly refrigerate the components of magnet 2, a conventional Gifford-McMahon cryocooler is rigidly attached to magnet 2 by conventional high thermal conductivity joints. In particular, one end flange 52 and magnet cartridge 12 are thermally connected by the high thermal conductivity joints to the first and second stages of the cryocooler, respectively. Typically, magnet cartridge 12 is maintained at approximately 10 K. while coil/shields 8 and 22, via end flange 52, are maintained at approximately 50 K. Because of the limited capacity of commercially available Gifford-McMahon refrigerators, the current leads which power the main coils should be demountable once the coil is placed in persistent mode so that when the gradient coils are pulsed their additional heat load to the refrigerator can be removed. The operating temperature of the refrigerator is determined by its heat load. Since the resistivity of the copper conductors used for the gradient windings, and hence their resistive heating at a given current, is temperature dependent around 50 K, the exact operating temperature cannot be determined a priori. An estimate of the heat inputs (in Watts) to the first stage of the refrigerator for a typical 0.5T magnet system using Signa-type gradient coils is set forth below in Example 1. The generation is based on a set of gradient windings designed using the standing design tools to fit in the prototype magnet and operated at an rms current of 25 A (peak of 84 A) for a typical imaging pulse sequence.

EXAMPLE 1

| Thermal radiation form 300K | 8.0 W |
| --- | --- |
| Conduction down gradient supports | 1.3 W |
| Conduction down magnet supports | 4.8 W |
| Conduction from dual cryocooler interface | 15.0 W |
| Conduction down gradient power leads | 9.6 W |
| Conduction down main coil power leads | 11.0 W |
| Generation in the gradient coils at 50K | 27.0 W |
| Total | 76.7 W |

The refrigerator chosen must be capable of removing this much heat at its first stage while maintaining a temperature of 50 K.; such a machine is available from Leybold-Heraeus. Note that the heat input from a dual cryocooler interface is accounted for; such a device is useful from a standpoint of increasing the reliability of the system. Note also that the conduction down the main coil power leads, 14% of the total, can be eliminated if the magnet can be made to operate in the persistent mode and a set of retractable conduction cooled leads is implemented for the magnet leads as set forth in U.S. patent application Ser. No. 07/759,336. Such an improvement would lead to a lower operating temperature for the gradient coils, therefore lower heat generation and improved second stage capacity or reduced second stage temperature as the refrigerator load map shows a temperature increase at the second stage with increased first stage heat load.

Magnet 2 is an improvement over prior, refrigerated superconducting MR magnets for several reasons. First, because magnet cartridge 12 is positioned between the inner and outer gradient coils 22 and 8, respectively, its size and therefore, the size of vessel 4 are substantially reduced which reduces the weight and the cost of magnet 2. Second, due to the fact that coil/shield assemblies 8,22 and magnet cartridge 12 have been relocated, this means that only a small volume will be magnetized by magnet 2 which reduces the amount of superconductor material needed for coils 14,16,18,20 which again reduces the weight and cost of magnet 2. Third, because coil/shield assemblies 8,22 are now operated at 50° K., the amount of resistivity is down by a factor of about 20 from room temperature (300° K.) which reduces the resistive input power and the amount of heat generated by a factor of 20 which, ultimately, reduces cooling cost and therefore the cost of operating magnet 2. Fourth, because the gradient coil assemblies 8 and 22 are operated in a vacuum, the acoustic noise created by the gradient coil is not conducted outside of vessel 4 which reduces the patient's discomfort associated with acoustic noise. Finally, the patient's claustrophobic fear associated with being in an enclosed environment is reduced by the short length of magnet 2.

Once given the above disclosure, many other features, modifications or improvements will become apparent to the skilled artisan. Such features, modifications or improvements are, therefore, considered to be a part of this invention, the scope of which is to be determined to by the following claims.

What is claimed is:

1. A refrigerated MR imaging magnet for reducing eddy currents, said magnet comprised of:
    at least two gradient coil/thermal shield means located at a predetermined distance away from each other for substantially reducing eddy currents;
    a magnet cartridge means having a coil form means and a coil means wound on said coil form means and substantially located radially between said gradient coil/thermal shield means for generating a substantially uniform magnetic field;
    a refrigeration means operatively connected to said gradient coil/thermal shield means and said magnet cartridge means for refrigerating said gradient coil/thermal shield means and said magnet cartridge means;
    a support means for supporting said gradient coil/thermal shield means and said magnet cartridge means;
    a vacuum enclosure means which substantially encloses said gradient coil/thermal shield means and said magnet cartridge means;
    a RF shield means rigidly attached to said vacuum enclosure means for substantially preventing a RF field from leaving said magnet;
    a passive shim means substantially located adjacent to said vacuum enclosure means means for correcting said magnetic field; and
    a RF coil means located at a predetermined distance away from said vacuum enclosure means for producing said RF field.

2. The magnet, according to claim 1, wherein said gradient coil/thermal shield means are further comprised of:
    a fiber-reinforced epoxy material; and
    a gradient coil set located substantially adjacent to said epoxy material.

3. he magnet, according to claim 1, wherein one of said gradient coil/thermal shield means is further comprised of:
    a shield gradient coil; and
    an outer thermal shield located substantially adjacent said shield gradient coil.

4. The magnet, according to claim 1, wherein one of said gradient coil/thermal shield means is further comprised of:
    a main gradient coil; and
    an inner thermal shield located substantially adjacent said main gradient coil.

5. The magnet, according to claim 1, wherein said vacuum enclosure means is further comprised of:
    a vacuum-tight fiber-reinforced epoxy material.

6. The magnet, according to claim 1, wherein said coil means is further comprised of:
    at least one superconducting winding means for generating a substantially uniform magnetic field.

7. The magnet, according to claim 1, wherein said enclosure means is further comprised of:
    a metallic vacuum vessel means;
    an end plate rigidly attached to said vessel means; and
    a vacuum bore tube means located at a predetermined distance away from said vacuum vessel and operatively connected to said end plate.

8. The magnet, according to claim 1, wherein said at least two gradient coil/thermal shield means are rigidly and thermally attached by a first flange means for providing thermal stability for said magnet.

9. The magnet, according to claim 7, wherein said RF coil means is rigidly and thermally attached to said end plate by a second extension means for providing structural stability for said magnet.

10. The magnet, according to claim 7, wherein said end plate is further comprised of:
    a cap means.

11. The magnet, according to claim 7, wherein said support means is further comprised of:
    a first support means such that one of said at least two gradient coil/thermal shield means is operatively connected to said first support means; and
    a second support means which is operatively connected to said magnet cartridge means.

12. The magnet, according to claim 11, wherein said first and second support means are rigidly attached to said end plate for providing structural stability for said magnet.

13. The magnet, according to claim 11, wherein said first support means is further comprised of:
    at least four members located along one of said at least two gradient coil means at substantially 90° from each said member for providing structural and thermal stability for said magnet.

14. The magnet according to claim 11, wherein said first support means is further comprised of:
    a first support; and
    a first mechanical support operatively connected to said first support.

15. The magnet, according to claim 11, wherein said second support means is further comprised of:
    a second support; and
    a second mechanical support operatively connected to said second support.

* * * * *